(12) United States Patent
Lin

(10) Patent No.: US 6,818,948 B2
(45) Date of Patent: Nov. 16, 2004

(54) SPLIT GATE FLASH MEMORY DEVICE AND METHOD OF FABRICATING THE SAME

(75) Inventor: Chi-Hui Lin, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/621,597

(22) Filed: Jul. 16, 2003

(65) Prior Publication Data

US 2004/0075137 A1 Apr. 22, 2004

(30) Foreign Application Priority Data

Oct. 21, 2002 (TW) .......................................... 91124262 A

(51) Int. Cl.[7] .......................... H01L 29/76; H01L 29/94; H01L 31/113; H01L 31/119; H01L 21/336

(52) U.S. Cl. ........................ 257/330; 257/316; 257/317; 257/318; 257/319; 257/320; 257/329; 257/331; 257/332; 438/212; 438/259; 438/270; 438/271; 438/587; 438/588; 438/589

(58) Field of Search ................................. 257/316–320, 257/329–332; 438/212, 259, 270–271, 587–589

(56) References Cited

U.S. PATENT DOCUMENTS

| | | | | | |
|---|---|---|---|---|---|
| 5,078,498 A | * | 1/1992 | Kadakia et al. | ............. | 257/330 |
| 5,281,548 A | * | 1/1994 | Prall | ............ | 438/259 |
| 6,232,632 B1 | * | 5/2001 | Liu | ............. | 257/315 |
| 6,583,466 B2 | * | 6/2003 | Lin et al. | ..................... | 257/314 |
| 2002/0175365 A1 | * | 11/2002 | Hirayama | ................... | 257/329 |
| 2004/0077147 A1 | * | 4/2004 | Lin | ............. | 438/259 |

* cited by examiner

Primary Examiner—Amir Zarabian
Assistant Examiner—Ida M. Soward
(74) Attorney, Agent, or Firm—Ladas & Parry LLP

(57) ABSTRACT

A split gate flash memory device and method of fabricating the same. A cell of the split gate flash memory device in accordance with the invention is disposed in a cell trench within a substrate to achieve higher integration of memory cells.

30 Claims, 17 Drawing Sheets

SPLIT GATE FLASH MEMORY DEVICE AND METHOD OF FABRICATING THE SAME

BACKGROUND OF THE INVENTION

1. Field of the Invention

The present invention relates to a semiconductor device and method of fabricating the same. More particularly, it relates to a split gate flash memory device that can achieve high memory cell capacity.

2. Description of the Related Art

Complementary metal oxide semiconductor (CMOS) memory is generally categorized into two groups: random access memory (RAM) and read only memory (ROM). RAM is a volatile memory, wherein the stored data is erased when power is turned off. On the contrary, turning off power does not affect the stored data in a ROM.

In the past few years, market share of ROM has been continuously expanding, and the type attracting the most attention has been flash memory. The fact that a single memory cell is electrically programmable and multiple memory cell blocks are electrically erasable allows flexible and convenient application, superior to electrically programmable read only memory (EPROM), electrically erasable programmable read only memory (EEPROM) and programmable read only memory (PROM). Furthermore, fabricating flash memory is cost effective. Having the above advantages, flash memory has been widely applied in consumer electronic products, such as digital cameras, digital video cameras, mobile phones, notebooks, personal stereos and personal digital assistants (PDA).

Since portability of these electrical consumer products is strongly prioritized by consumers, the size of the products must be minimal. As a result, capacity of flash memory must increase, and functions must be maximized while size thereof is continuously minimized. Having an increased amount of access data, capacity of memory cells has been enhanced from 4 to 256 MB, and even 1G byte will become the market trend in the near future.

Hence, there is a need for a flash memory device with high memory cell capacity.

SUMMARY OF THE INVENTION

Accordingly, an object of the invention is to provide a split gate flash memory device that can achieve high integration of memory cells thereof.

Another object of the invention is to provide a method of fabricating a split gate flash memory device, wherein the size of memory cells thereof can be reduced.

Thus, a split gate flash memory cell in accordance with the present invention comprises a substrate having a trench therein and a conductive layer disposed on the bottom of the trench. A pair of source regions are each disposed in the substrate adjacent to one sidewall of the trench and electrically connected by the conductive layer. A source isolation layer is disposed on the conductive layer. A pair of tunnel oxide layers are each disposed on one sidewall of the trench and on the source isolation layer. A U-shaped floating gate having a plurality of inside tips is disposed on the source isolation layer and contacts the tunnel oxide layers thereby. An inter-gate dielectric layer is disposed on the U-shaped floating gate. A control gate is disposed on the inter-gate dielectric. A conductive stud is disposed on the control gate and a drain region disposed in the substrate adjacent to the trench.

Furthermore, the method of fabricating the split gate flash memory cell in accordance with the present invention comprises providing a substrate, forming a plurality of parallel long trenches along a first direction in the substrate, forming a conductive layer and a pair of source regions on the bottom of each long trench, wherein the source regions are respectively disposed in the substrate adjacent to two sidewalls of each long trench and electrically connected by the conductive layer therein, forming a source isolation layer on each conductive layer, forming a tunnel oxide on two sidewalls of each long trench, forming a U-shaped floating gate with a plurality of inside tips and a connecting oxide layer therein on each source isolation layer, forming an inter-gate dielectric layer on each U-shaped floating gate and the connecting oxide layer therein, forming a control gate on each inter-gate dielectric layer, forming a conductive stud on each control gate, forming a plurality of parallel shallow trench isolation (STI) regions along a second direction, defining a plurality of cell trenches, and forming a drain region in the substrate adjacent to each cell trench.

In the present invention, the trench-type split gate flash memory device disposed in cell trenches within a substrate can achieve higher integration of memory cell capacity than that in the Prior Art.

In addition, most of the fabricating processes in the invention are self-aligned and additional lithography processes and number of masks for the whole fabricating process can be reduced. The complexity of fabricating thereof is thus reduced and can be easily achieved.

Furthermore, most patterns of the masks for fabricating the stacked gate flash memory device are rectangular and can be easily fabricated. The costs of mask fabrication can be reduced and resolution limitations by the photolithography tools can be reduced.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
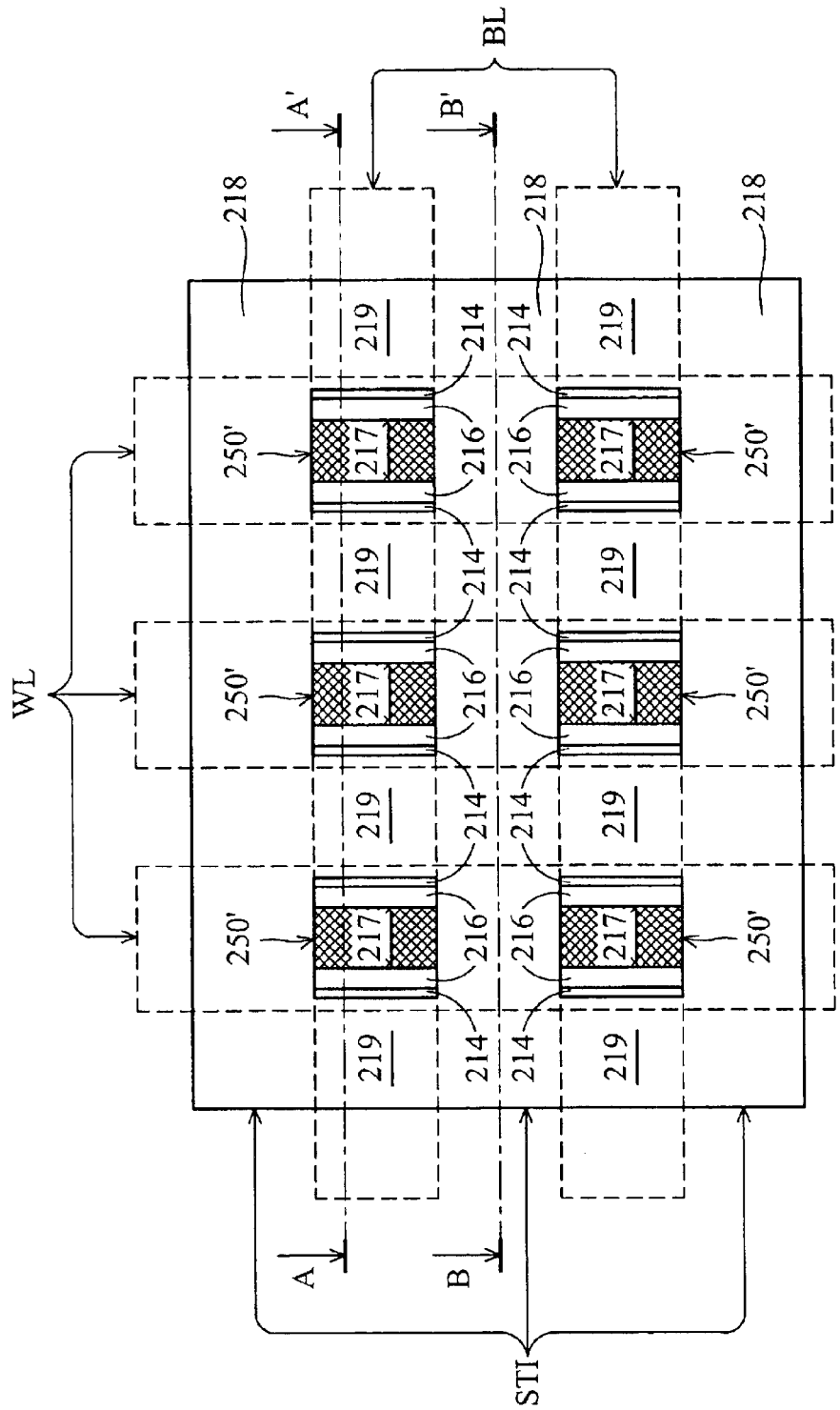
FIG. 1 is schematic top view of split gate flash memory devices of the invention.

The present invention provides a split gate flash memory device that can meet demands for increased capacity of memory cells. In FIG. 1, a top view of the split gate flash memory device in accordance with the present invention is shown. Structure of individual memory cells is disposed in the cell trenches (referring to trench 250') along the A~A' phantom line, between two shallow isolation trench (referring to STI) regions along the B~B' phantom line.

FIGS. 3a~3m and FIGS. 4a~4m respectively illustrate the cross-sections of a fabricating process along lines A~A' and lines B~B' according to an embodiment of the present invention. Moreover, FIGS. 2a and 2b also illustrate corresponding top views of the fabricating process.

Figure 3A:
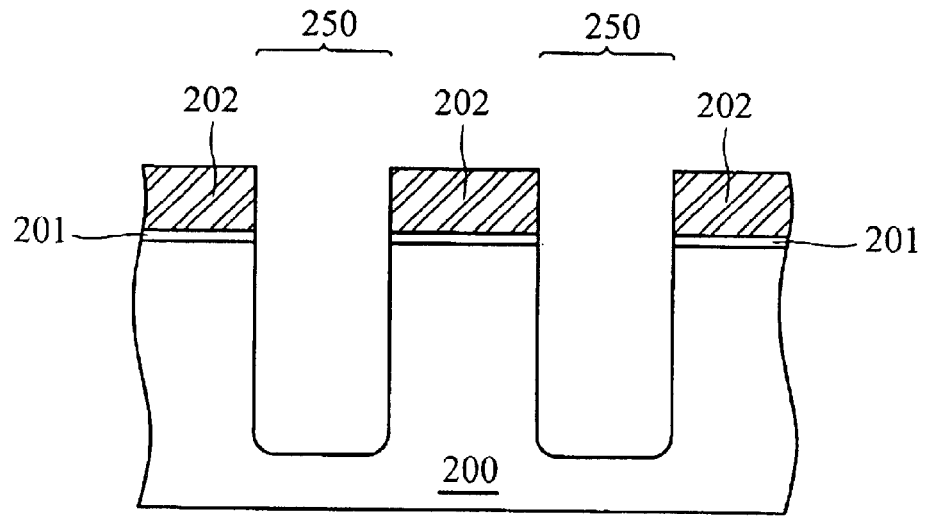
FIGS. 3a~3m are cross-sections of the fabricating process along the A–A' phantom line in FIG. 1.
Figure 3B:
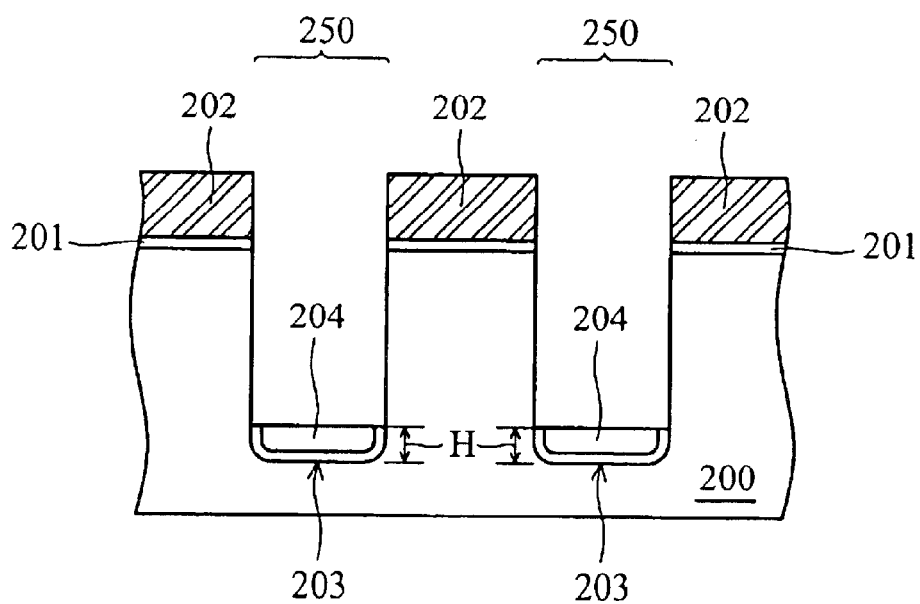
Figure 3C:
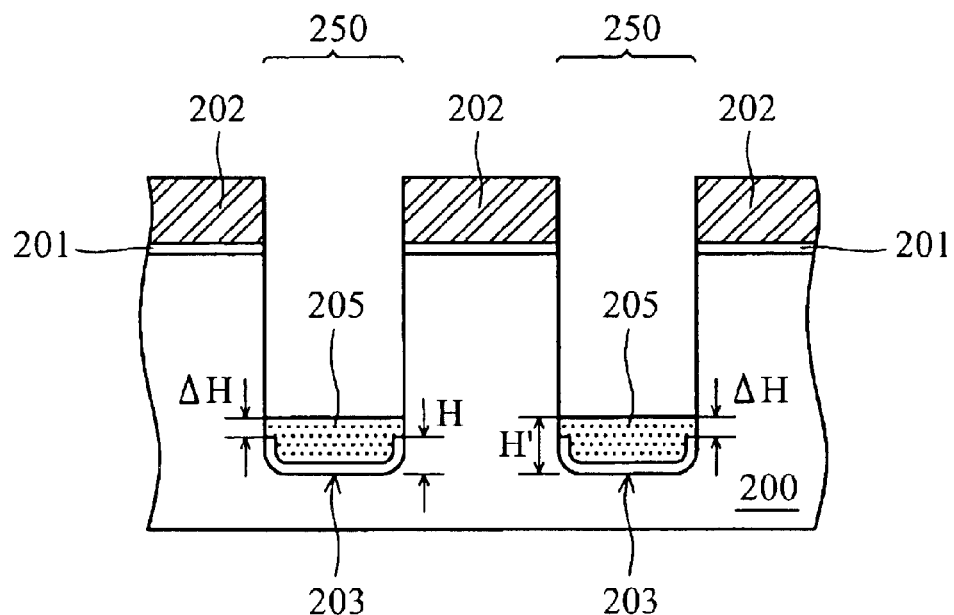
Figure 3D:
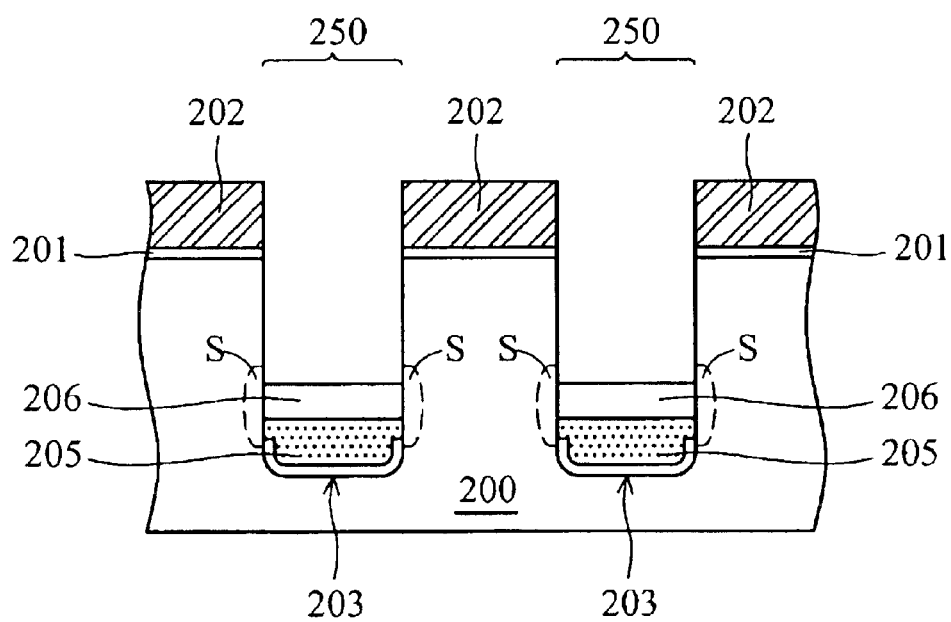
Figure 3E:
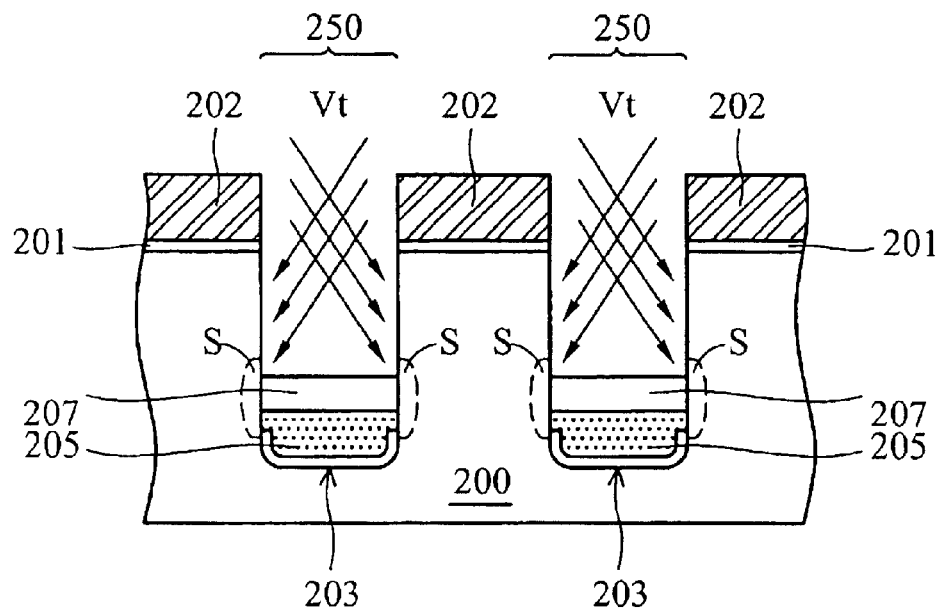
Figure 3F:
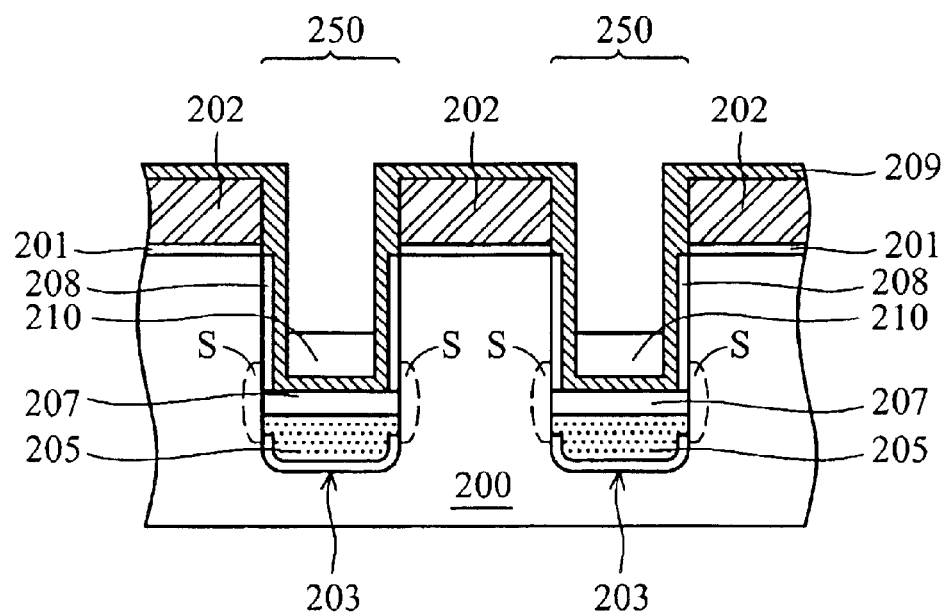
Figure 3G:
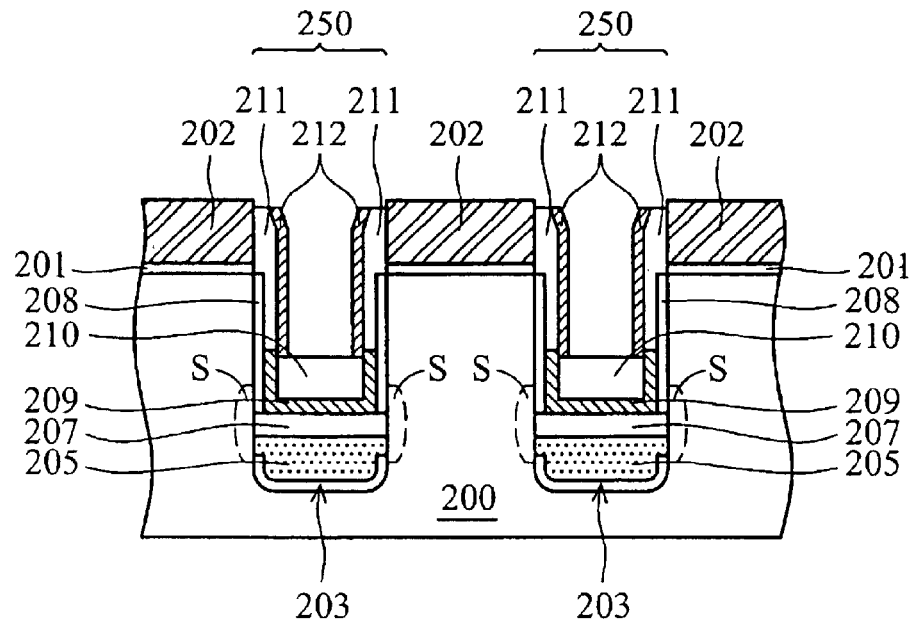
Figure 3H:
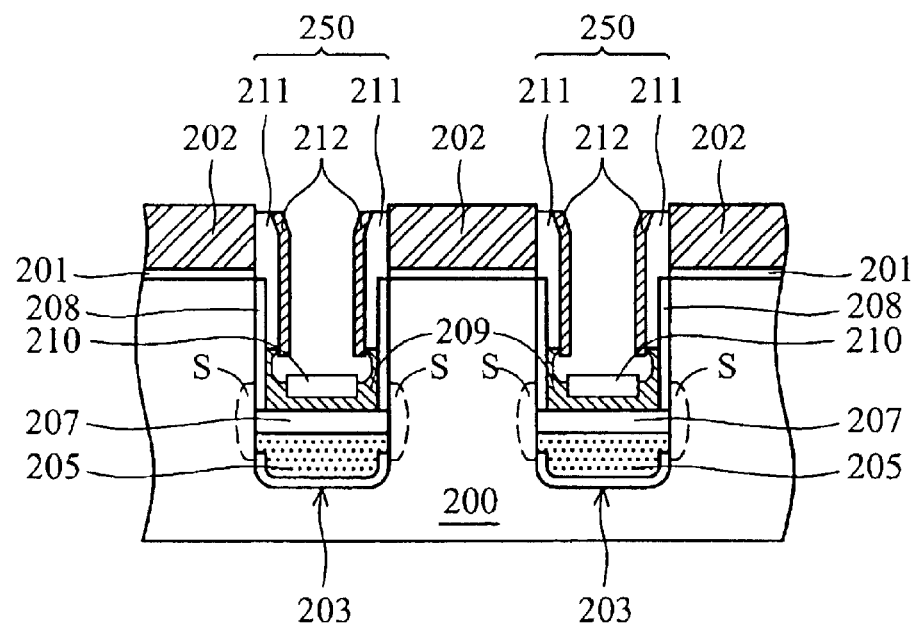
Figure 3I:
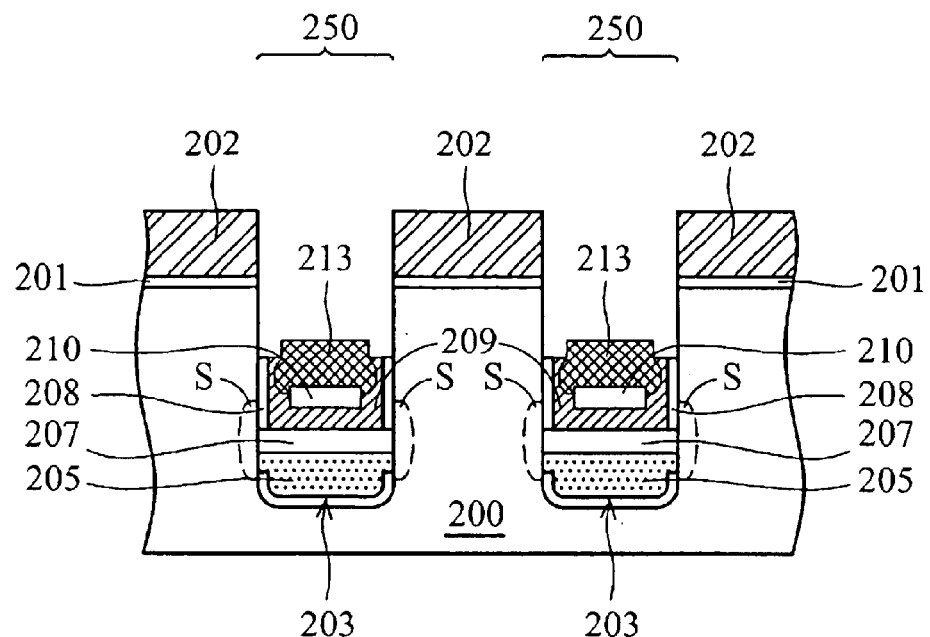
Figure 3J:
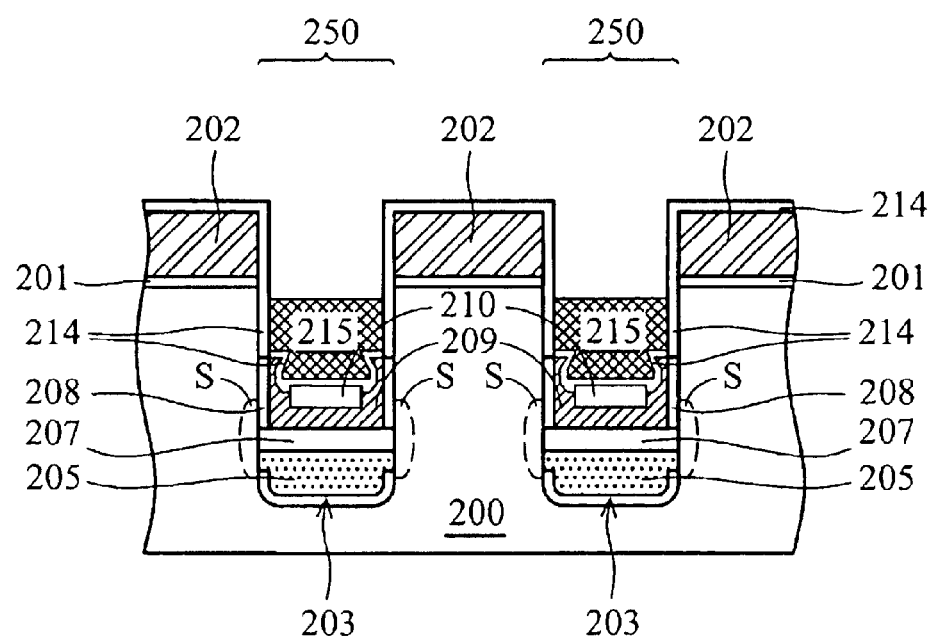
Figure 3K:
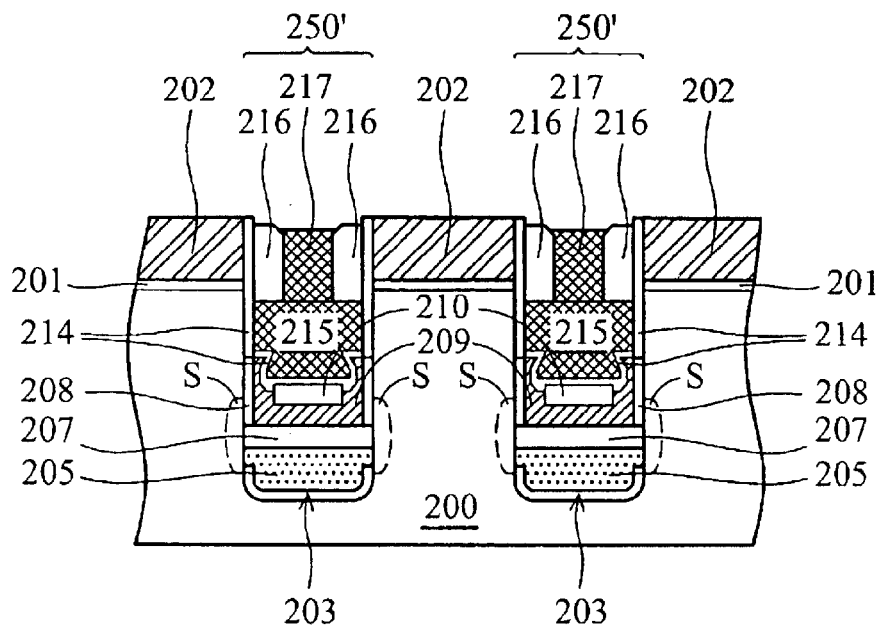
Figure 3L:
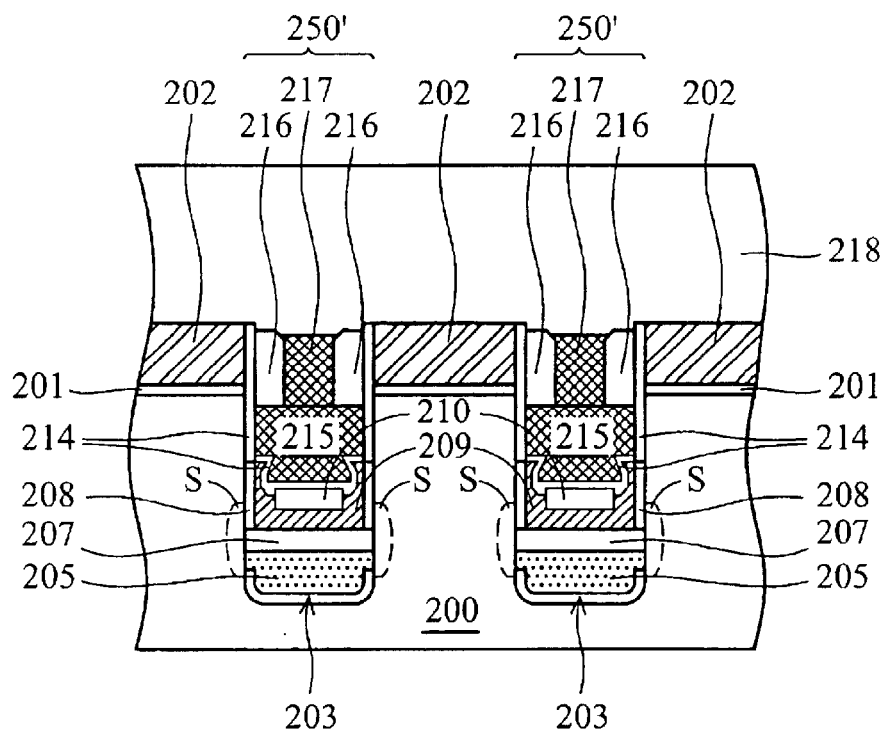
Figure 3M:
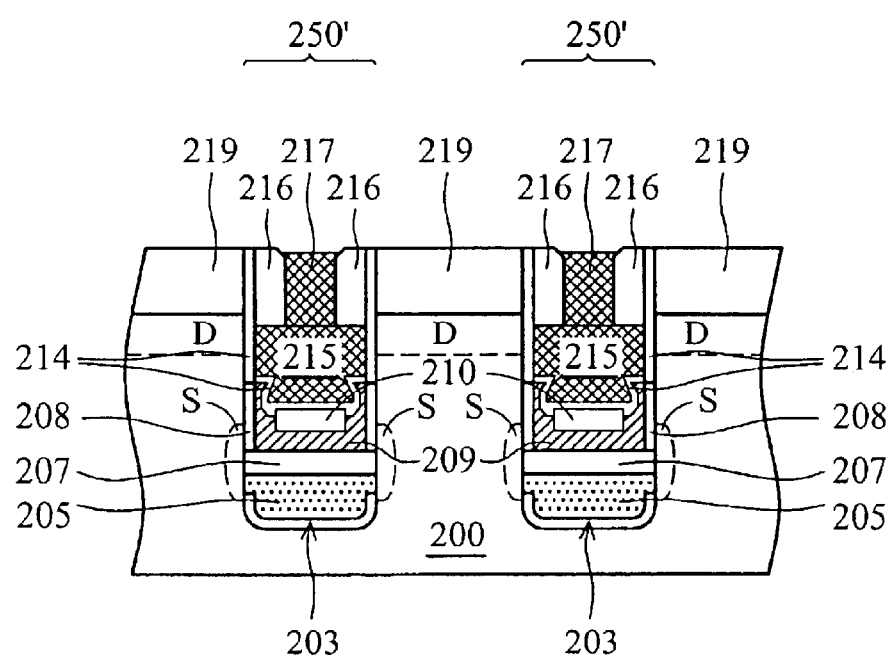

First, FIG. 3m illustrates a cross-section of the split gate flash memory cells in accordance with the present invention. A memory cell comprises a trench 250' disposed in the substrate 200, and a conductive layer 205 disposed on the bottom of the trench 250'. A pair of source regions S are each disposed in the substrate adjacent to sidewalls of the trench 250'. A source isolation layer 207 is disposed on the conductive layer 205. A pair of tunnel oxide layers 208 are each respectively disposed on one sidewall of the trench 250' and the source isolation layer 207. A U-shaped floating gate 209 having a plurality of inside tips is disposed on the source isolation layer 207 and contacts the tunnel oxide layers 208 thereby. An inter-gate dielectric layer 214 is disposed on the U-shaped floating gate 209. A control gate 215 is disposed on the inter-gate dielectric 214. A conductive stud 217 is disposed on the control gate 215, and a drain region D is disposed in the substrate 200 adjacent to the trench 250'.

Figure 2A:
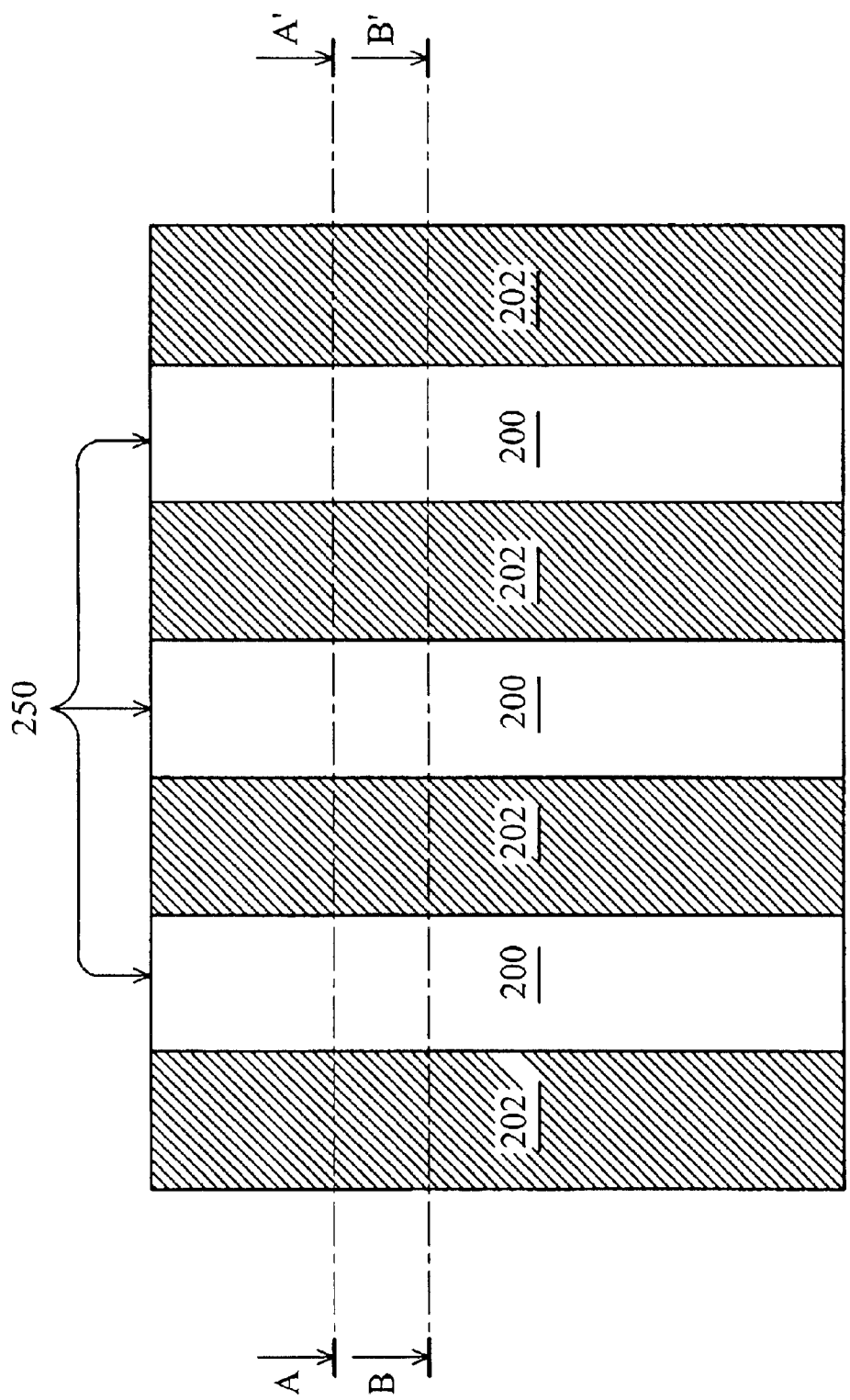
FIG. 2a is a schematic top view of corresponding cross-sections in FIG. 3a and FIG. 4a of one embodiment of the invention.
Figure 4A:
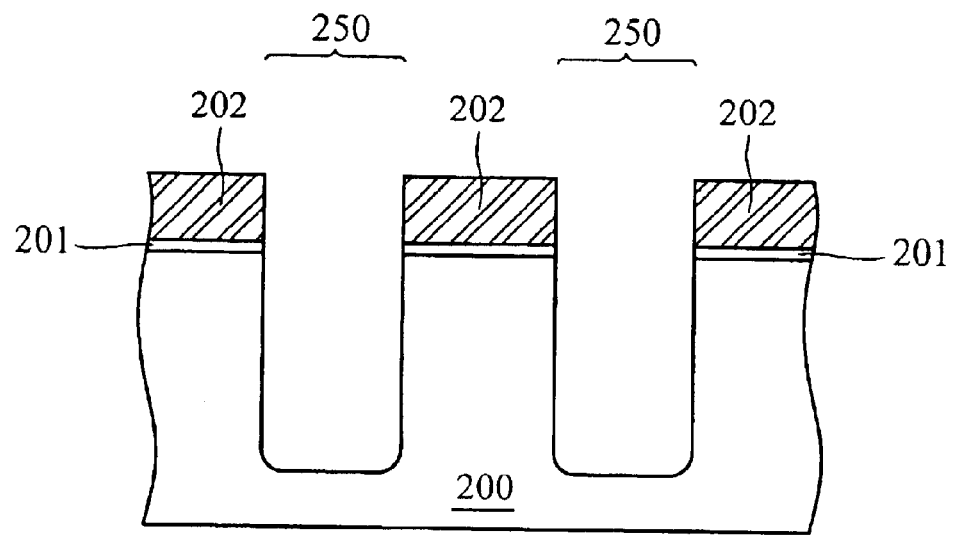
FIGS. 4a~4m are cross-sections of the fabricating process along the B–B' phantom line in FIG. 1.

In FIGS. 3a and 4a, a semiconductor substrate 200, for example a P-type silicon substrate, is provided. Next, a pad oxide layer 201 and a mask layer 202 are sequentially formed on the substrate 200 and then sequentially defined by subsequent lithography and etching, forming a plurality of long trenches 250 with a depth about 30000 Å to 70000 Å in the substrate 200. The long trenches 250 are parallel to each other along a first direction. This top view is shown in FIG. 2a and the depth of a long trench 250 affects the channel length of each split gate flash memory cell.

Figure 4B:
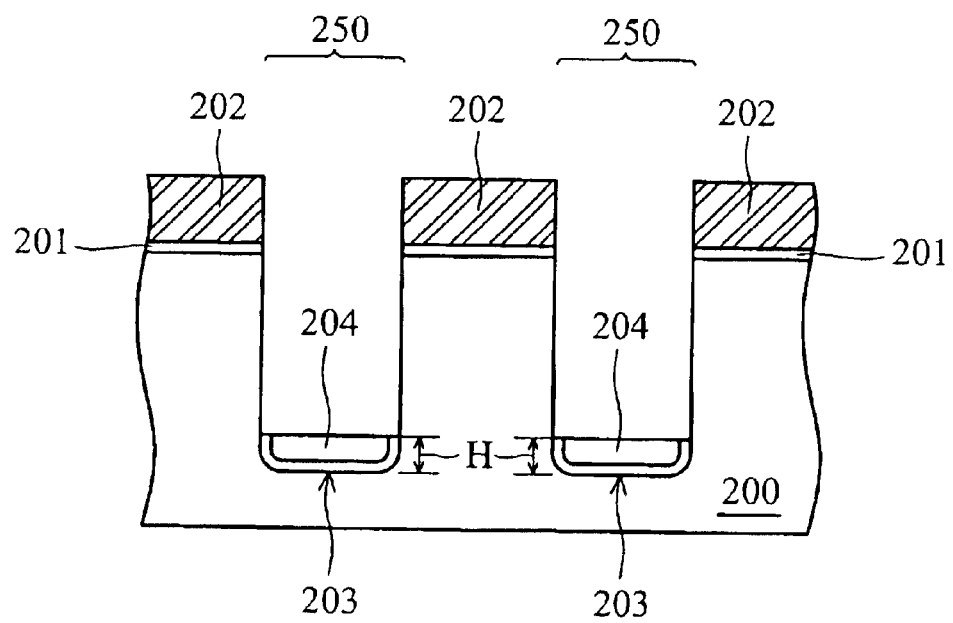

Next, in FIGS. 3b and 4b, a conformal bottom insulating layer 203 is deposited on mask layer 203 and in the long trench 250. The material of the insulating layer 203, for example, can be silicon dioxide. Then materials of a protecting layer 204 are deposited on the bottom insulating layer 230 filling the long trench 250. Material of the protecting layer 204, for example, can be photoresist. Materials of the protecting layer 204 are then etched back and recessed to a depth H to the bottom of the long trench 250. Then the bottom insulating layer 203 exposed by the residue protecting layer 203 is removed. Thus, a bottom insulating layer 203 having the same height H as the protecting layer 204 is left in the long trench 250.

Figure 4C:
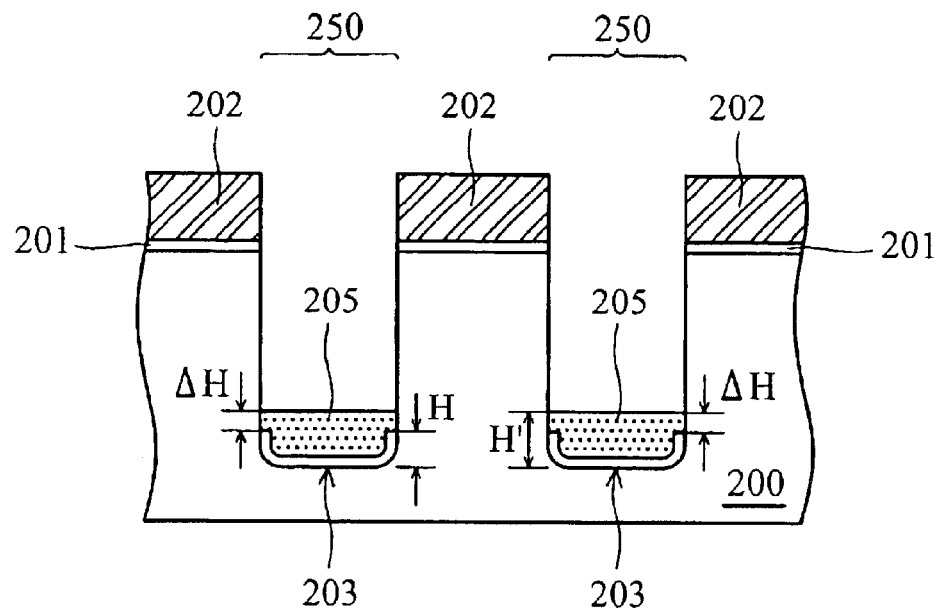

In FIGS. 3c and 4c, the residue protecting layer 204 in the long trench 250 is then removed by a proper solvent (not shown). Next, conductive materials of a conductive layer 205, for example N-type dopant doped polysilicon, are filled in the long trench 250 and on the mask layer 202. Then the conductive materials above the mask layer 202 are etched back and the conductive materials in the long trench 250 are recessed to a depth H' to the bottom of the long trench 250. Thus, a conductive layer 205 with a thickness H' is left in the long trench 250. Moreover, a depth difference ΔH between the bottom insulating layer 203 and the conductive layer 205 is about 100 Å to 200 Å.

Figure 4D:
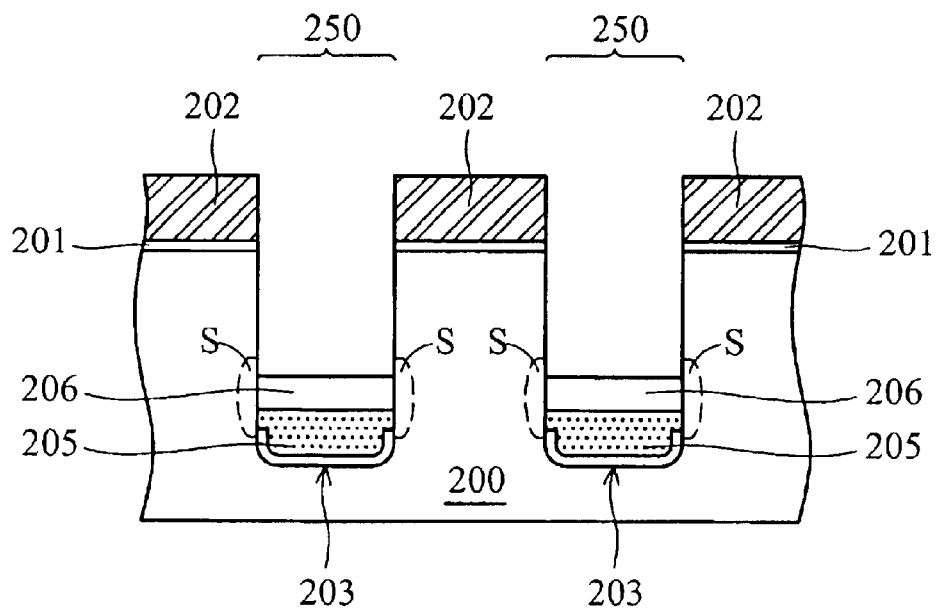

In FIGS. 3d and 4d, a source material layer 206 is formed in the long trench 250 by sequential deposition, etching and recession of doped materials. The doped material of the source material layer 206 can be, for example, N-type dopant doped silicon dioxide and preferably phosphorous (P) doped or arsenic (As) doped silicon dioxide formed by LPCVD. Thickness of the source material layer 206 is between 500 Å and 1000 Å.

Next, a thermal annealing process, for example a furnace annealing process, is performed on drive out dopants (such as arsenic) from the source material layer 206 into the substrate 200 adjacent to the long trench 250. Thus, a pair of source regions S are respectively formed in the substrate 200 and electrically connected by the conductive layer 205 therebetween.

Figure 4E:
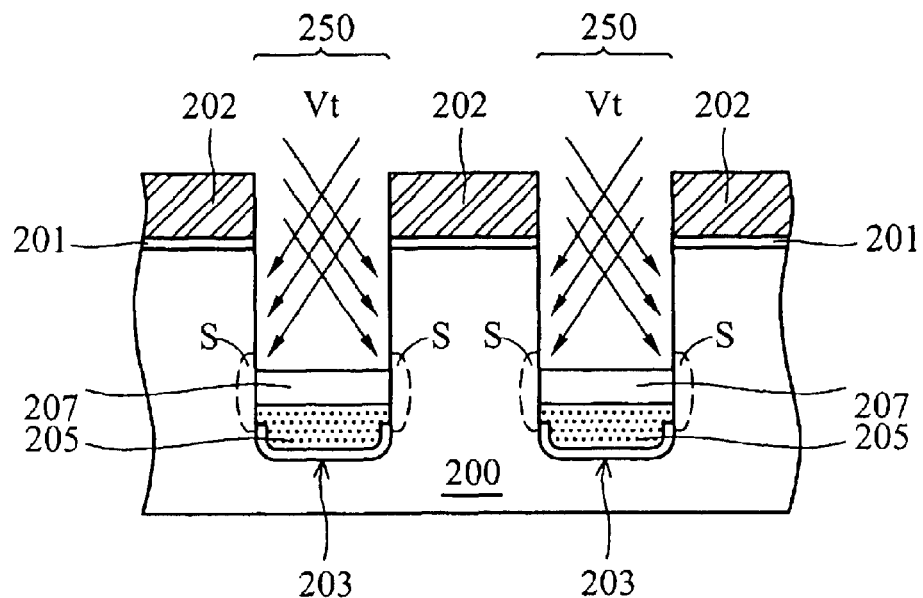

In FIG. 3e and FIG. 4e, the source material layer 206 in the long trench 250 is then removed. Next, a source isolation layer 207 with a thickness between 350 Å and 850 Å is formed on the conductive layer 205, and limitation of an electrical connection between the source regions S is fully achieved by the conductive layer 205 therebelow. The source isolation layer 207 is formed by sequential deposition, etch-back, and recession of insulating materials such as silicon dioxide, for example. Next, a threshold voltage implantation Vt is performed on sidewalls of the long trench 250 to adjust the threshold voltage of each memory cell.

Figure 4F:
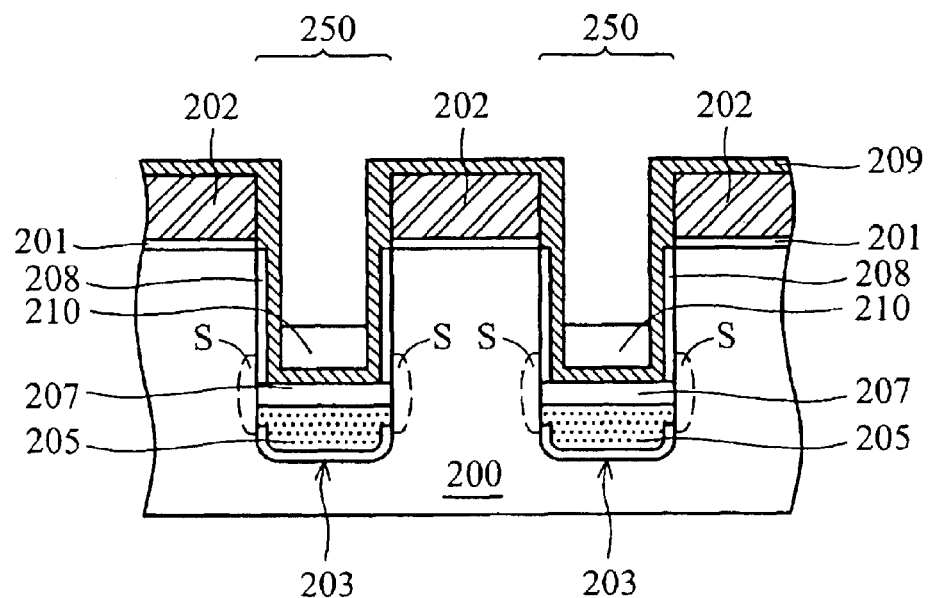

In FIG. 3f and FIG. 4f, a tunnel oxide layer 208 is formed on the two sidewalls of the long trench 250. The tunnel oxide layer 208 can be, for example, silicon dioxide formed by thermal oxidation. Next, a conformable floating gate layer 209 is formed on the mask layer 202 and in the long trench 250. Materials of the floating gate layer 209 can be, for example, N-type dopant doped polysilicon formed by LPCVD. Next, a connecting oxide layer 210 with a thickness between 700 Å and 1500 Å is formed in the long trench 250. The connecting oxide layer 210 is formed by sequential deposition, etch-back, and recession of materials such as silicon dioxide. The connecting oxide layer 210 therein can lower the coupling ratio between the floating gate and the control gate of the flash memory cells of the present invention.

Figure 4G:
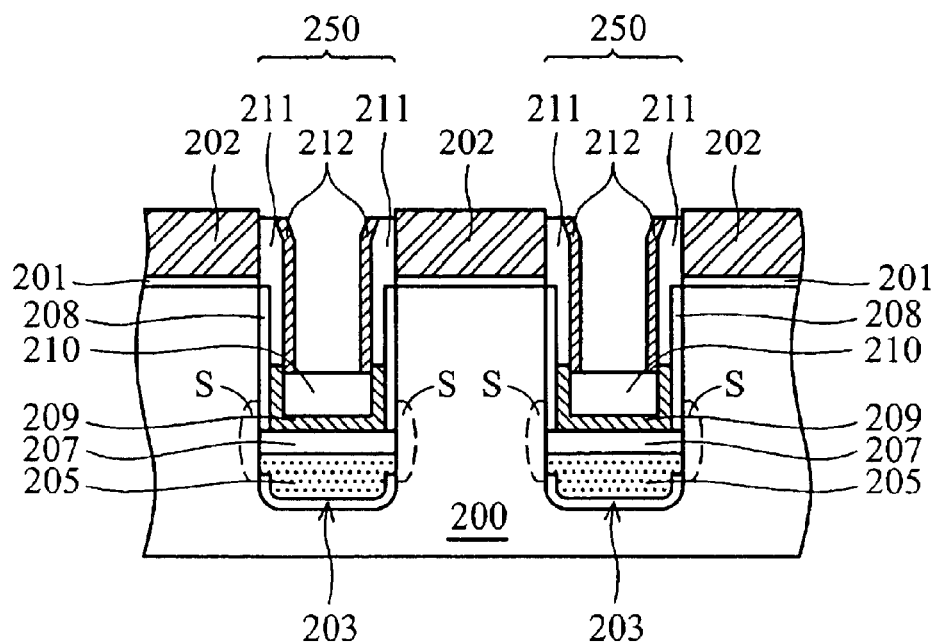

In FIGS. 3g and 4g, portions of the floating gate layer 209 exposed by the connecting oxide layer 210 are removed, leaving a U-shaped floating gate layer 209 in the long trench 250 as a floating gate. Then a conformable floating gate oxide spacer layer 211 is formed on the mask layer 202 and in the long trench 250 and etched, leaving floating gate oxide spacers 211 covering part of the tunnel oxide 208 on sidewalls of the long trench 250. The conformable floating gate oxide spacer layer 211 is formed by LPCVD, for example. In addition, materials of the floating oxide spacer layer 211 and the connecting oxide layer 210 are the same, such as silicon dioxide here. Thus, during etching of the floating gate oxide spacer layer 211, the connecting oxide layer 210 is lightly etched and the thickness thereof is also decreased by the described etching. Then a floating gate nitride spacer 212 is formed on each floating gate oxide space 211 by sequentially depositing a conformable floating gate nitride spacer and etching thereon. The conformable floating gate nitride spacer layer 212 is formed by LPCVD, for example.

Figure 4H:
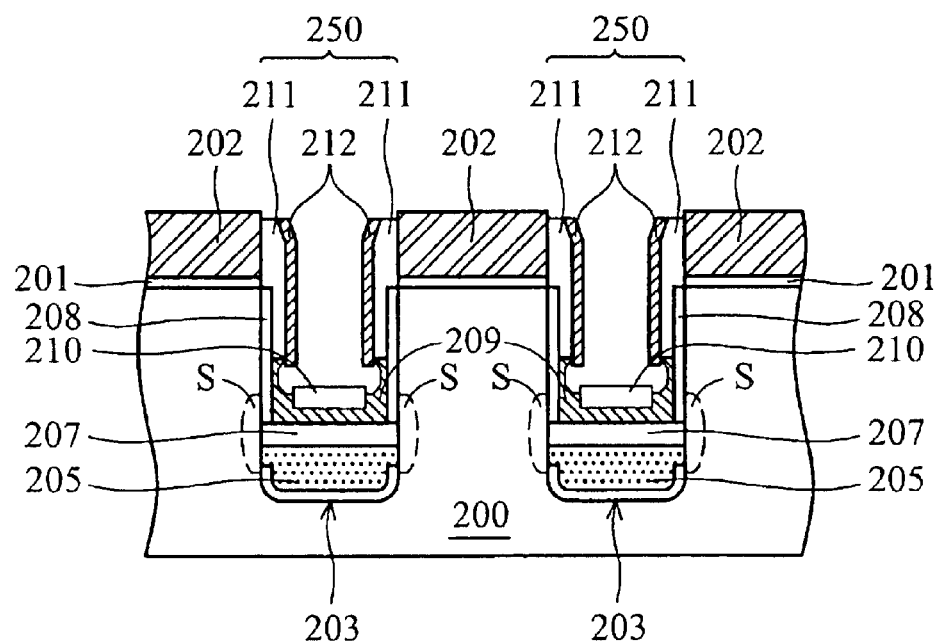

In FIG. 3h and FIG. 4h, the connecting oxide layer 210 can be etched, for example, by wet etching to further lower a thickness about 200 Å to 500 Å thereof by exposure of the floating gate nitride spacers 212 and insides of the U-shaped floating gate 209. Next, the insides of the U-shaped floating gate 209 are isotropically etched and a plurality of tips is formed thereon. Thus, in the long trench 250 a U-shaped floating gate 209 with a plurality of inside tips and a connecting oxide layer 210 therein is formed on the source isolation layer 207 therein.

Figure 4I:
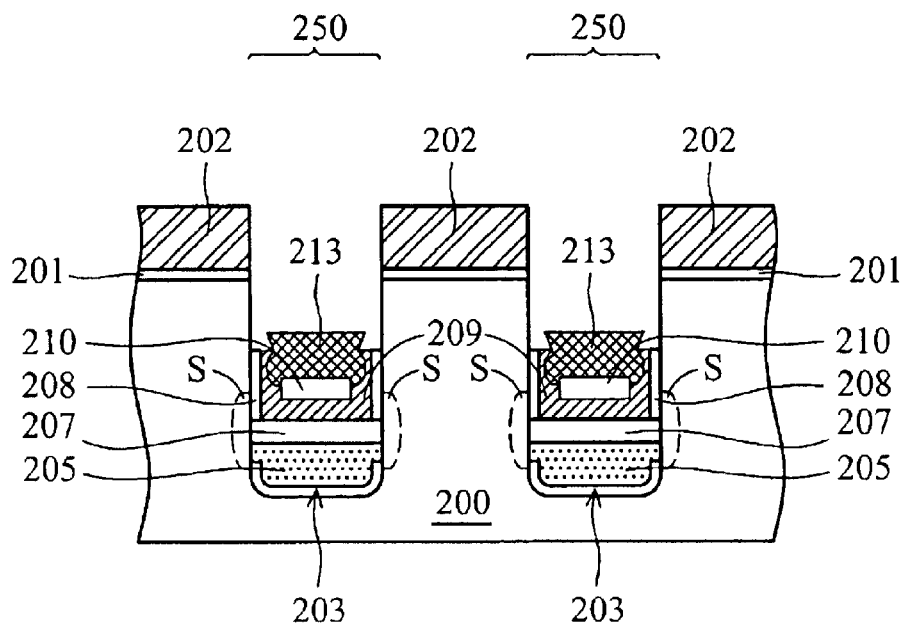

In FIG. 3i and FIG. 4i, the floating gate nitride spacers 212 can be removed, for example, by wet etching. Then, another protecting layer 213 with a thickness between 500 Å and 1000 Å is formed in the long trench 250. Materials of the protecting layer 213 can be, for example, photoresist (PR). Then wet etching removes the floating gate oxide spacers 211 and portions of the tunnel oxide layers 208 from the sidewall of the long trench 250 using the protecting layer 213 as a masking layer.

Figure 4J:
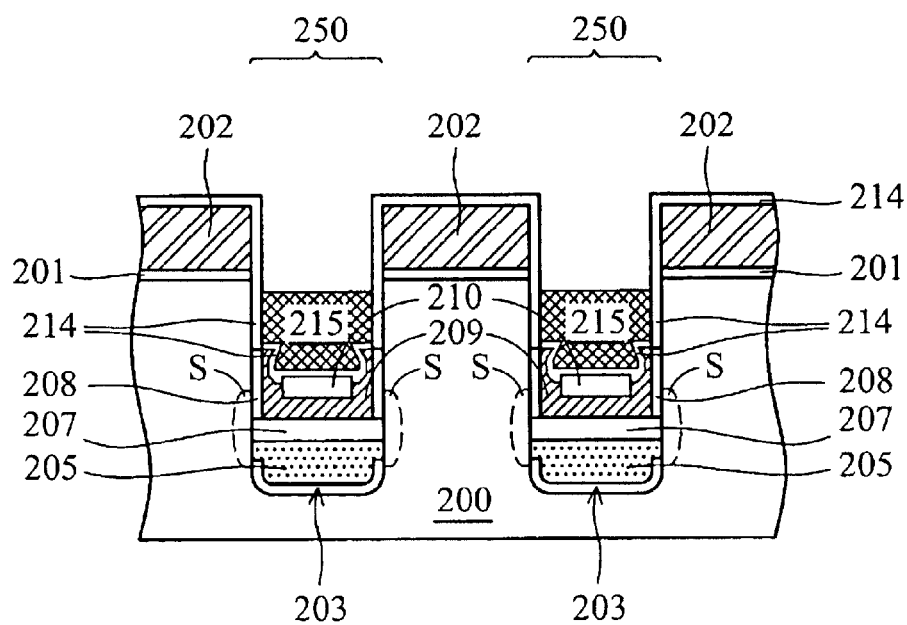

In FIG. 3j and FIG. 4j, the protecting layer 213 is then removed using suitable solvent. Next, a conformable inter-gate dielectric layer 214 formed by LPCVD, for example, can be deposited on the mask layer 202 and in the long trench 250. The material of the inter-gate dielectric layer 214 can be, for example, silicon dioxide. Then a control gate layer 215 is formed in the long trench 250 having a height slightly lower than that of the surface of the substrate 200 as a control gate. The control gate layer 215 is formed by sequential deposition, etch-back, and recession of materials like N-type dopant doped polysilicon formed by LPCVD, for example.

Figure 4K:
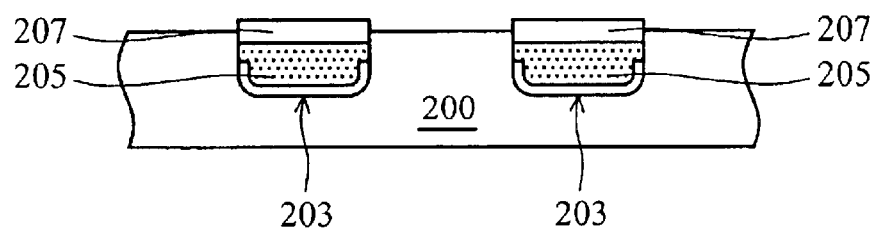

In FIG. 3k and FIG. 4k, a conformable layer of control gate spacer layer 216 is deposited and then etched by subsequent etching. Thus, a control gate oxide spacer 216 is formed on each sidewall of the long trench 250. The material of the control gate oxide spacer 216 can be, for example, silicon dioxide. Next, materials of a conductive stud 217 are deposited on the mask layer 202 filling the long trench 250 followed by etching. Thus, a conductive stud 217 is formed in the long trench 250 as a connection of the control gate (referring to the control gate layer 215) therebelow and a wordline formed by subsequent processes (not shown).

Figure 2B:
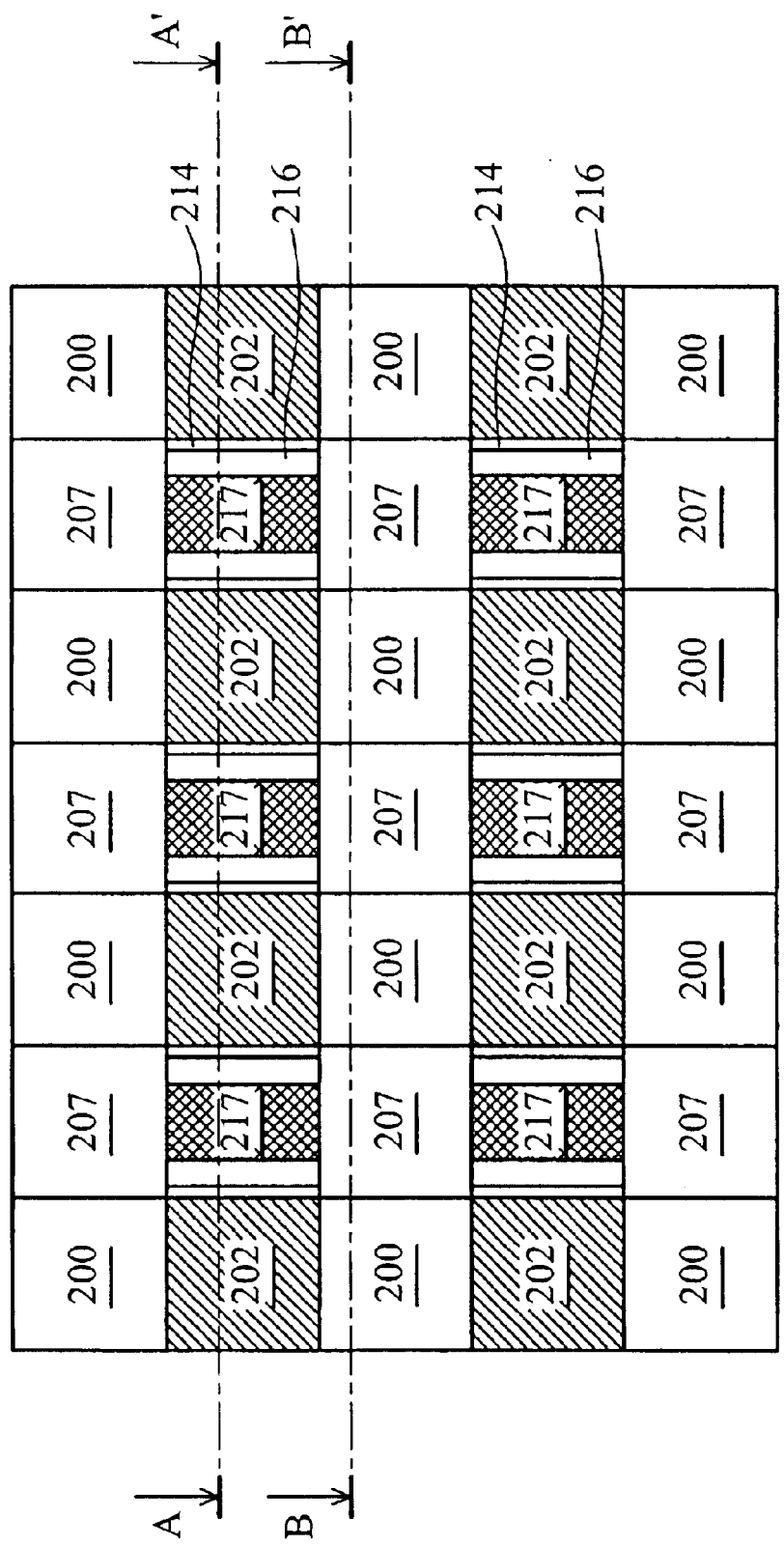
FIG. 2b is a schematic top view of corresponding cross-sections in FIG. 3k and FIG. 4k of one embodiment of the invention.

Next, a plurality of parallel long isolation trenches are formed in the substrate 200 (shown in FIG. 4K) along a second direction, perpendicular to the first direction of the long trenches 250 by sequential lithography and etching. The described etching process stops at the source isolation layer 207 of the long trench 250 therein and a plurality of trenches 250' comprising the cell structures is thus defined in the substrate 200. This top view is shown in FIG. 2b. FIG. 3k shows a cross-section along the A–A' line where the trenches comprising cell structures are located and FIG. 4k shows a cross-section along the B–B' where follow-up shallow trench isolation (STI) regions are located.

Figure 4L:
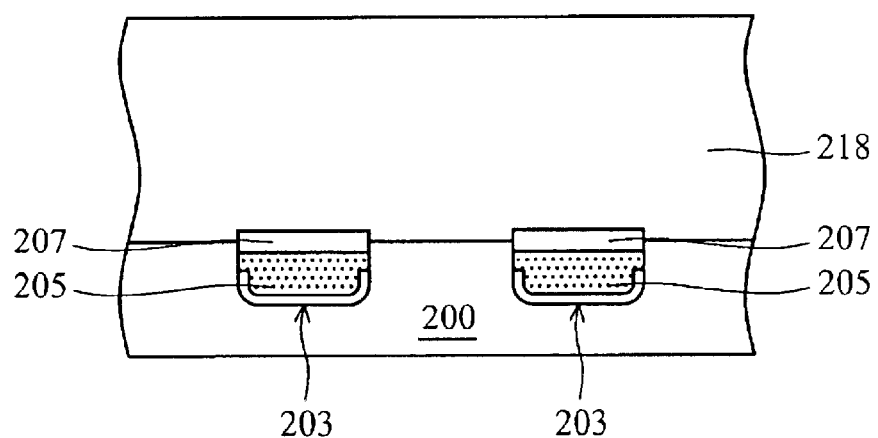

In FIG. 3l and FIG. 4l, materials of an insulating layer 218 are filled in the described long isolation trenches. The insulating material can be, for example, silicon dioxide formed by high density plasma chemical vapor deposition (HDP CVD).

Figure 4M:
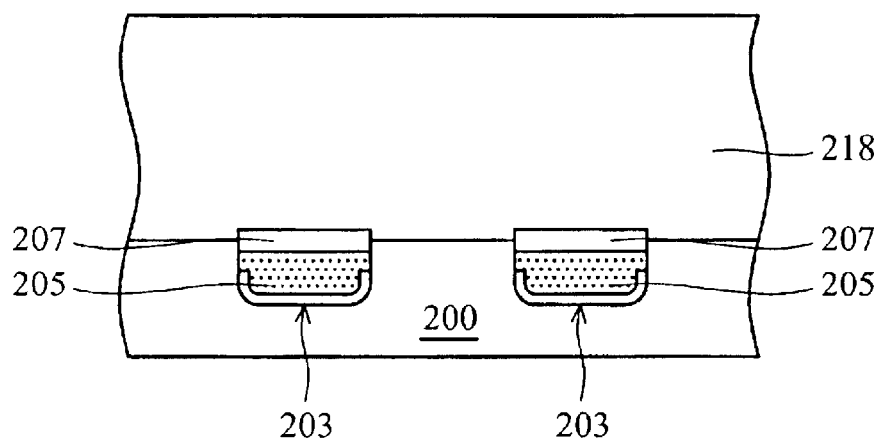

In FIG. 3m and FIG. 4m, a planarization process is then performed on level the wafer using the mask layer 202 as a polishing stop layer, leaving an insulating layer 218 therein and the shallow trench isolation (STI) region is thus formed. Next, the mask layer 202 is removed by, for example, wet etching, and the pad oxide layer 201 therebelow is exposed. Then a drain implantation (not shown) is performed on implant N-type impurities such as phosphorous (P) or arsenic (As) ions into the substrate 200. Then a thermal annealing process (not shown), for example a rapid thermal annealing (RTP) process, is performed and drain regions D are thus respectively formed in the substrate 200 adjacent to each trench 250'. Then the pad oxide layer 201 is removed and a second insulating layer 219 is formed on each drain region D. The second insulating layer 219 is formed by sequential deposition and planarization of materials of the second insulating layer 219. After the planarization, the wafer surface is leveled and the conductive stud 217 is thus exposed.

In FIG. 1, a top view illustrating possible follow-up wordline BL and bitline WL is shown. In FIG. 1, the conductive studs 217 within the cell trenches (referring to trench 250') are further connected by the interconnecting hypothesis wordlines WL and hypothesis bitlines BL in phantom structures. In addition, the bitlines BL can also connect the drain regions D therebelow by a proper contact window (not shown) and the split gate flash memory devices are thus formed.

Compared with the flash memory cell of the Prior Art, the present invention has the following advantages.

First, cells of the flash memory device in accordance with the invention are trench-type split gate flash memory device, disposed in cell trenches within a substrate rather than those normally disposed on the surface of a substrate in the Prior Art. Memory cell design of the invention can thus achieve higher integration capacity than that in the Prior Art.

In addition, most of the fabricating processes in the invention are self-aligned. Thus, additional lithography processes and the number of masks for the whole fabricating process can be reduced. The complexity of fabricating the split gate flash memory device of the present invention is reduced and can be easily achieved.

Second, cells of the split gate flash memory device of the present invention are formed into the substrate. Thus, the size of each flash memory cell is minimized and the integration of the memory cell increased, allowing capacity of a flash memory device to be increased and the current within a cell also increased by enlarging the depth of the cell trench. Furthermore, most patterns of the masks for fabricating the stacked gate flash memory device are rectangular and can be easily fabricated. The costs of mask fabrication can be reduced as can resolution limitations by photolithography tools.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A split gate flash memory cell, comprising:
a substrate having a trench therein;
a conductive layer disposed on the bottom of the trench;
a pair of source regions, each disposed in the substrate adjacent to one sidewall of the trench and electrically connected by the conductive layer;
a source isolation layer disposed on the conductive layer;
a pair of tunnel oxide layers, respectively disposed on one sidewall of the trench and on the source isolation layer;
a U-shaped floating gate having a plurality of inside tips disposed on the source isolation layer and contacting the tunnel oxide layers thereby;
an inter-gate dielectric layer disposed on the U-shaped floating gate;
a control gate disposed on the inter-gate dielectric;
a conductive stud disposed on the control gate; and
a drain region disposed in the substrate adjacent to the trench.

2. The cell as claimed in claim 1, wherein a bottom insulating layer is further disposed under the conductive layer.

3. The cell as claimed in claim 2, wherein the bottom insulating layer is silicon dioxide.

4. The cell as claimed in claim 1, wherein the U-shaped floating gate and the control gate are N-type dopant doped polysilicon.

5. The cell as claimed in claim 1, wherein the inter-gate dielectric layer is silicon dioxide.

6. The cell as claimed in claim 1, wherein the conductive layer is N-type dopant doped polysilicon.

7. The cell as claimed in claim 1, wherein the tunnel oxide layer is silicon dioxide.

8. The cell as claimed in claim 1, wherein the conductive stud is N-type dopant doped polysilicon.

9. The cell as claimed in claim 1, wherein a connecting oxide layer is further disposed between the U-shaped control gate and the inter-gate dielectric layer.

10. The as claimed in claim 9, wherein the connecting oxide layer is silicon dioxide.

11. The as claimed in claim 1, wherein the substrate is P-type silicon substrate.

12. A method of fabricating split gate flash memory cells, comprising the steps of:
   providing a substrate;
   forming a plurality of parallel long trenches along a first direction in the substrate;
   forming a conductive layer and a pair of source regions on the bottom of each long trench, wherein the source regions are respectively disposed in the substrate adjacent to two sidewalls of each long trench and electrically connected by the conductive layer therein;
   forming a source isolation layer on each conductive layer;
   forming a tunnel oxide on two sidewalls of each long trench;
   forming a U-shaped floating gate with a plurality of inside tips and a connecting oxide layer therein on each source isolation layer;
   forming an inter-gate dielectric layer on each U-shaped floating gate and the connecting oxide layer therein;
   forming a control gate on each inter-gate dielectric layer;
   forming a conductive stud on each control gate;
   forming a plurality of parallel shallow trench isolation (STI) regions along a second direction, defining a plurality of cell trenches; and
   forming a drain region in the substrate adjacent to each cell trench.

13. The method as claimed in claim 12, wherein the first direction is perpendicular to the second direction.

14. The method as claimed in claim 12, wherein the substrate is P-type silicon substrate.

15. The method as claimed in claim 12, further comprising before forming a plurality of parallel long trenches along a first direction in the substrate, the step of sequentially forming a pad oxide layer and a mask layer on the substrate.

16. The method as claimed in claim 15, wherein the mask layer is silicon nitride.

17. The method as claimed in claim 15, wherein the pad oxide layer is silicon dioxide.

18. The method as claimed in claim 12, further comprising before forming a conductive layer and a pair of source regions on the bottom of each long trench, the step of forming a bottom insulating layer on the bottom of each long trench.

19. The method as claimed in claim 12, wherein forming a conductive layer and a pair of source regions on the bottom of each long trench further comprises the steps of:
   forming a source material layer in each long trench;
   performing a high temperature annealing process, driving out dopants in the source material layer, forming a pair of source regions in the substrate adjacent to two sidewalls of each long trench, electrically connected by the conductive layer therebetween; and
   removing the source material layer from each long trench.

20. The method as claimed in claim 19, wherein the source material layer is N-type doped silicon dioxide.

21. The method as claimed in claim 20, wherein the N-type doped silicon dioxide comprises phosphorous (P) doped silicon dioxide or arsenic (As) doped silicon dioxide.

22. The method as claimed in claim 12, further comprising before forming a tunnel oxide on two sidewalls of each long trench, performing a threshold voltage implantation on the sidewalls of each long trench.

23. The method as claimed in claim 12, wherein forming a U-shaped floating gate with a plurality of inside tips and a connecting oxide layer therein on the source isolation layer further comprises:
   conformably depositing a floating gate layer in each long trench;
   forming a connecting oxide layer on the floating gate layer in each long trench;
   removing portions of the floating gate layer exposed by the connecting oxide layer, forming a U-shaped floating gate with the connecting oxide layer therein;
   forming a floating gate oxide spacer on sidewalls of each long trench;
   forming a floating gate nitride spacer on the floating gate oxide spacer;
   partially etching the connecting oxide, exposing part of the inside U-shaped floating gate;
   isotropically etching the inside U-shaped floating gate, forming a plurality of tips on the insides thereof; and
   removing the floating gate oxide spacers, the floating gate nitride spacers, and part of the tunnel oxides adjacent to the sidewalls of each long trench, leaving a U-shaped floating gate with a plurality of inside tips and a connecting oxide layer therein.

24. The method as claimed in claim 23, wherein the method for partially etching the connecting oxide is wet etching.

25. The method as claimed in claim 12, further comprising before forming a conductive stud on the control gate, the step of forming control gate spacers on sidewalls of each long trench.

26. The method as claimed in claim 25, wherein the control gate spacer is silicon dioxide.

27. The method as claimed in claim 12, wherein forming a plurality of parallel shallow trench isolation (STI) regions along a second direction, and defining a plurality of cell trenches further comprises:
   sequentially performing a photolithography process and an etching process, defining a plurality of parallel long isolation trenches along a second direction, stopping at the source isolation layer therein; and
   forming an insulating layer in the long isolation trenches.

28. The method as claimed in claim 27, wherein the insulating layer is silicon dioxide.

29. The method as claimed in claim 27, wherein the method of forming the insulating layer is high density plasma enhanced chemically vaporization deposition (HDP CVD).

30. The method as claimed in claim 12, wherein forming a drain region in the substrate adjacent to each of the cell trenches further comprises:
   removing the mask layer, exposing the pad oxide layer;
   performing a drain implantation;
   performing a thermal annealing process, forming a drain region in the substrate adjacent to each cell trenches;
   removing the pad oxide layer; and
   forming a second insulating layer on each drain region.

* * * * *